(12) United States Patent
Takahashi et al.

(10) Patent No.: US 6,803,666 B2
(45) Date of Patent: Oct. 12, 2004

(54) SEMICONDUCTOR CHIP MOUNTING SUBSTRATE AND SEMICONDUCTOR DEVICE USING THE SAME

(75) Inventors: Takuya Takahashi, Tokyo (JP); Tadaharu Hashiguchi, Yokohama (JP); Kazuhiro Yamamoto, Naka-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 10/105,366

(22) Filed: Mar. 26, 2002

(65) Prior Publication Data

US 2002/0140110 A1 Oct. 3, 2002

(30) Foreign Application Priority Data

Mar. 27, 2001 (JP) ........................................ 2001-090951
Mar. 8, 2002 (JP) ........................................ 2002-064208

(51) Int. Cl.[7] ............................................. H01L 23/48
(52) U.S. Cl. ....................... 257/784; 257/774; 257/773; 257/776
(58) Field of Search ......................... 257/784, 773–774, 257/776

(56) References Cited

U.S. PATENT DOCUMENTS 5,216,278 A * 6/1993 Lin et al. .................... 257/688

* cited by examiner

Primary Examiner—Luan Thai
(74) Attorney, Agent, or Firm—Oblon, Spivak, McClelland, Maier & Neustadt, P.C.

(57) ABSTRACT

A wiring substrate has a semiconductor chip mounting surface. The semiconductor chip mounting surface is provided with a plurality of partially overlapping chip mounting areas capable of mounting a plurality of types of semiconductor chips with different chip sizes. A plurality of groups of conductive pads is formed on the wiring substrate corresponding to the semiconductor chips mountable on the respective chip mounting areas. Any one of the mountable semiconductor chips is mounted on any one of the chip mounting areas. A plurality of conductive pads on the semiconductor chip mounted on one chip mounting area is electrically connected to one of the groups of conductive pads.

11 Claims, 14 Drawing Sheets

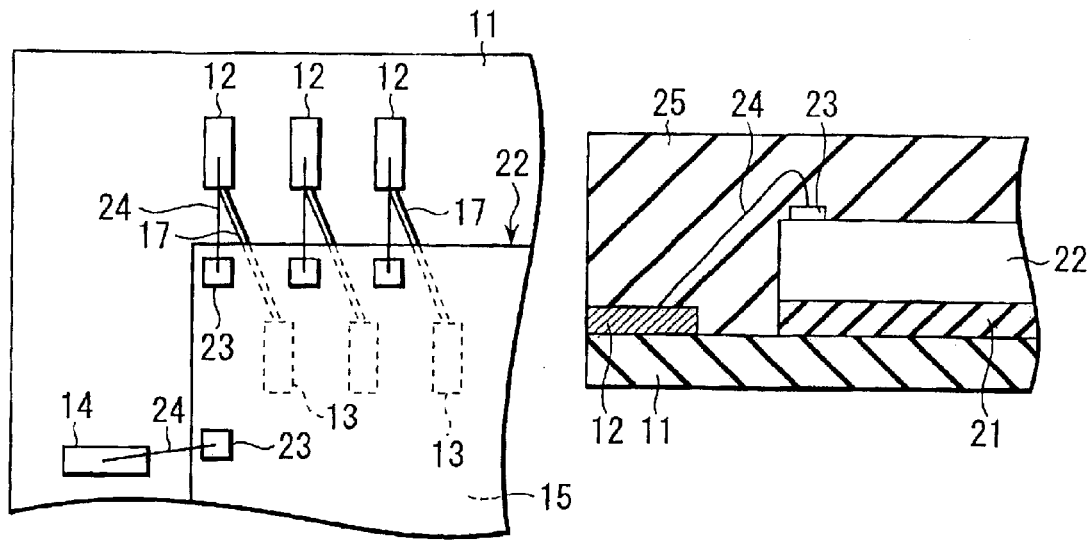
FIG. 2A
FIG. 2B
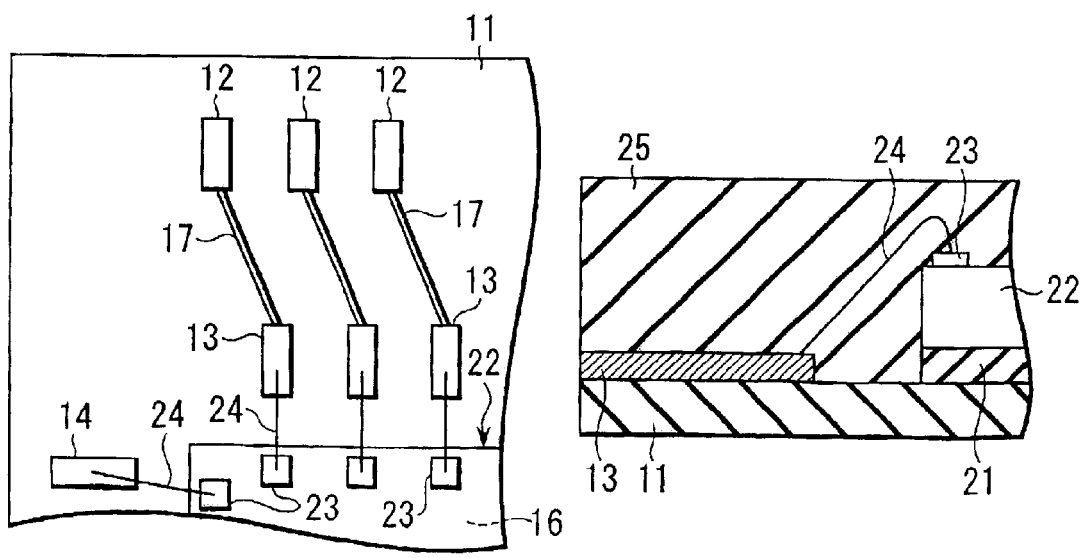
FIG. 3A
FIG. 3B

US 6,803,666 B2

SEMICONDUCTOR CHIP MOUNTING SUBSTRATE AND SEMICONDUCTOR DEVICE USING THE SAME

CROSS-REFERENCE TO RELATED APPLICATIONS

This application is based upon and claims the benefit of priority from the prior Japanese Patent Applications No. 2001-090951, filed Mar. 27, 2001 and No. 2002-064208, filed Mar. 8, 2002, the entire contents of both of which are incorporated herein by reference.

BACKGROUND OF THE INVENTION

1. Field of the Invention

The present invention relates to a semiconductor chip mounting substrate (a wiring substrate) and a semiconductor device using the same. More specifically, the present invention relates to a pattern layout of a semiconductor chip mounting substrate having a conductive pad formed on a semiconductor chip mounting surface of an insulated substrate and a semiconductor device mounting a semiconductor chip on the substrate.

2. Description of the Related Art

Conventionally, the semiconductor chip mounting substrate used for mounting semiconductor chips is configured as follows, for example. Namely, there are formed a plurality of conductive pads and wirings respectively connected to these pads on one side of the insulated substrate, i.e., on the semiconductor chip mounting surface. Further, a plurality of wirings is also formed on the rear of the substrate. There is formed a plurality of through-hole conductors piercing both insulated substrate surfaces for electrically connecting corresponding wirings formed on both substrate surfaces.

A semiconductor chip is mounted on the semiconductor chip mounting surface of the semiconductor chip mounting substrate by means of die bonding. A bonding wire connects a conductive pad formed on the chip with a conductive pad on the semiconductor chip mounting surface. Further, insulating resin is used for sealing so as to cover the semiconductor chip mounting surface of the semiconductor chip mounting substrate including the semiconductor chip and bonding wires.

Conventionally, the semiconductor chip mounting substrate is specially developed and designed for mounting a specific type of semiconductor chip having a given chip size. Accordingly, such semiconductor chip mounting substrate prescribes the number of conductive pads and the placement state thereof formed on the chip mounting surface so as to properly meet the pad arrangement for the specific type of semiconductor chip.

In other words, the conventional semiconductor device needs to use special semiconductor chip mounting substrates according to different types of semiconductor chips.

When the type of mounted chips is changed or the chip size is reduced due to shrink, the semiconductor device using the conventional semiconductor chip mounting substrate necessitates the development and design of a new semiconductor chip mounting substrate.

As a result, the prior art not only remarkably degrades efficiency of the semiconductor device development, but also increases types of semiconductor chip mounting substrates. There occurs many wasteful production line changeovers and management works, increasing manufacturing costs.

BRIEF SUMMARY OF THE INVENTION

According to a first aspect of the present invention, there is provided a wiring substrate comprises, an insulated substrate having a semiconductor chip mounting surface which provides a plurality of partially overlapping chip mounting areas capable of mounting a plurality of types of semiconductor chips with different chip sizes, and a plurality of conductive pads in a plurality of groups formed on the insulated substrate corresponding to semiconductor chips mountable on the plurality of chip mounting areas.

According to a second aspect of the present invention, there is provided a semiconductor device comprises, a wiring substrate having a semiconductor chip mounting surface which provides a plurality of partially overlapping chip mounting areas; a plurality of conductive pads in a plurality of groups formed on the wiring substrate corresponding to semiconductor chips mountable on the plurality of chip mounting areas, a semiconductor chip which is mounted on one of the plurality of chip mounting areas, the semiconductor chip having a plurality of conductive pads on the top surface, and a plurality of bonding wires to electrically connect the plurality of conductive pads provided on the top surface of the semiconductor chip with the plurality of conductive pads in a group corresponding to a semiconductor chip mounted on the chip mounting area.

BRIEF DESCRIPTION OF THE SEVERAL VIEWS OF THE DRAWINGS

FIGS. 2A and 2B are a plan view and a sectional view of a semiconductor device using the semiconductor chip mounting substrate in FIG. 1;

FIGS. 3A and 3B are a plan view and a sectional view of another semiconductor device using the semiconductor chip mounting substrate in FIG. 1;

DETAILED DESCRIPTION OF THE INVENTION

Embodiments of the present invention will be described in further detail with reference to the accompanying drawings.

Figure 1:
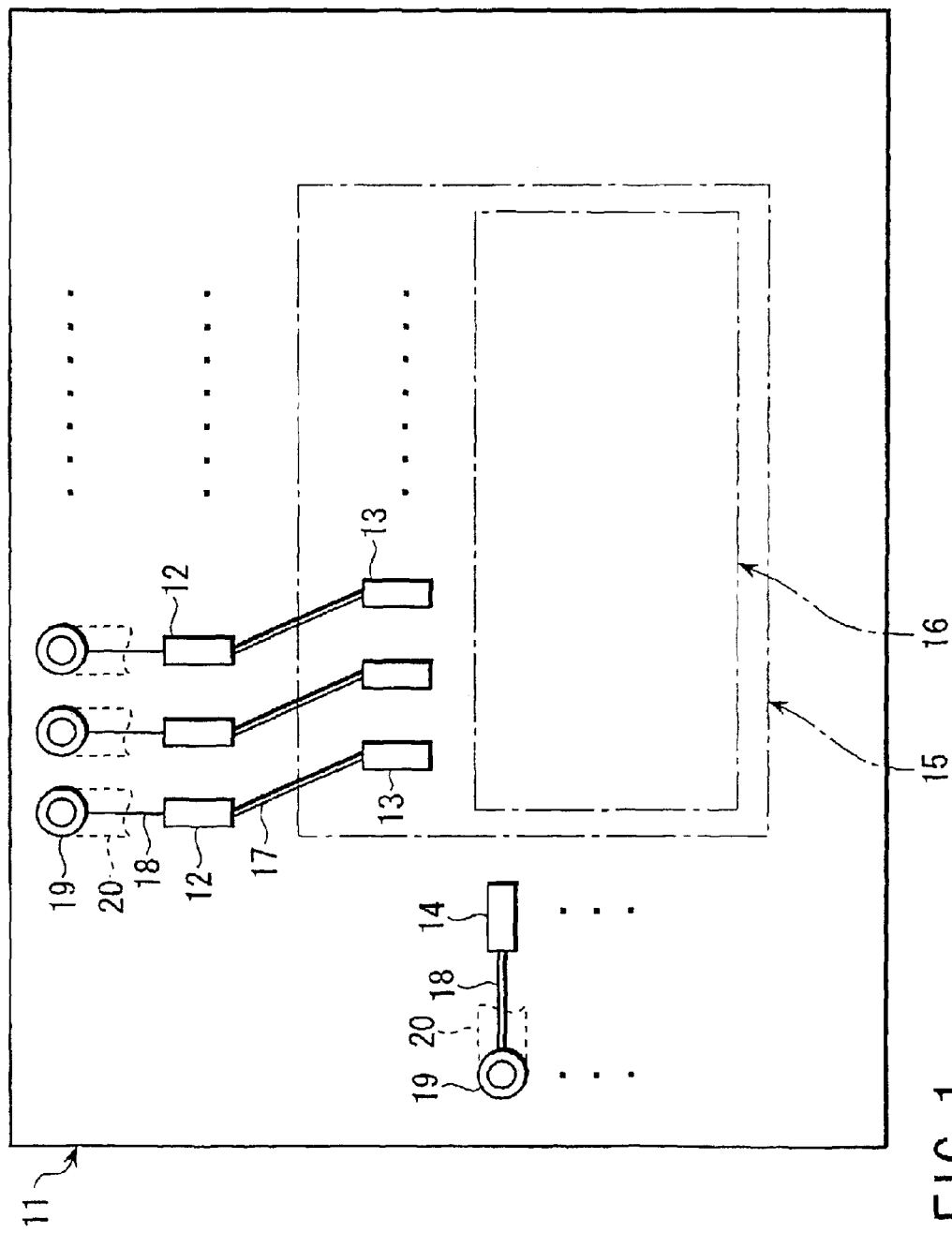
FIG. 1 is a plan view of a semiconductor chip mounting substrate according to a first embodiment of the present invention.

FIG. 1 is a plan view showing a pattern layout of a semiconductor chip mounting substrate (a wiring substrate) according to a first embodiment of the present invention viewed from the semiconductor chip mounting surface.

In FIG. 1, a semiconductor chip mounting substrate 11 comprises an insulated substrate using, e.g., synthetic resin as a base material. On one side of the semiconductor chip mounting substrate 11, i.e., the semiconductor chip mounting surface, there are formed a first group of conductive pads 12, a second group of conductive pads 13, and a third group of conductive pads 14. The semiconductor chip mounting substrate 11 is rectangular and has the size of, e.g., 12 mm×18 mm or 20 mm×28 mm. The conductive pads 12, 13, and 14 in each group are rectangular and have the size of, e.g., 0.3 mm×0.15 mm.

The semiconductor chip mounting substrate 11 is provided with a plurality of chip mounting areas for mounting a plurality of types of semiconductor chips with different chip sizes. FIG. 1 shows provision of two chip mounting areas 15 and 16 for mounting two types of semiconductor chips with different chip sizes. The chip mounting areas 15 and 16 partially overlap with each other on the semiconductor chip mounting substrate 11.

As an example of a plurality of types of semiconductor chips, semiconductor memory chips have different storage capacities. As another example, two types of semiconductor chips have the same function but differ in size. One type has a chip size reduced by the shrink technique. The other type has a chip size before the shrink.

Of the first, second, and third groups of conductive pads 12, 13, and 14, the first group of conductive pads 12 lines up along a first side of the semiconductor chip mounting substrate 11 and are connected to a plurality of conductive pads on a large semiconductor chip mountable on the larger chip mounting area 15. Further, the second group of conductive pads 13 lines up along the first side of the semiconductor chip mounting substrate 11 and are connected to a plurality of conductive pads on a small semiconductor chip mountable on the smaller chip mounting area 16. Moreover, the third group of conductive pads 14 lines up along a second side orthogonal to the first side of the semiconductor chip mounting substrate 11. The third group is commonly used for semiconductor chips mountable on the chip mounting areas 15 and 16, and are connected to a plurality of conductive pads on the semiconductor chip mountable on the chip mounting area 15 or 16.

The number of pads and the placement state thereof are determined for the first, second, and third groups of conductive pads 12, 13, and 14 so as to correspond to the pad arrangements on the two types of semiconductor chips with different chip sizes mountable on the chip mounting areas 15 and 16 of the semiconductor chip mounting substrate 11. Accordingly, the total number of the first, second, and third groups of conductive pads 12, 13, and 14 is larger than the total number of pads on any one of the two types of mountable semiconductor chips.

The first and second groups of conductive pads 12 and 13, which are arranged along the first side of the semiconductor chip mounting substrate 11, include a plurality of sets of conductive pads corresponding to pads having the same function on two types of memory chips mountable on the chip mounting areas 15 and 16. The conductive pads having the same function in each set are interconnected via a plurality of inter-pad wirings 17 formed on the chip mounting surface.

A plurality of wirings 18 is connected corresponding to the first group of conductive pads 12. The plurality of wirings 18 is arranged and formed on the semiconductor chip mounting substrate 11 and connected to corresponding wirings 20 via a plurality of through-hole conductors 19 piercing both sides of the semiconductor chip mounting substrate 11. The wirings 20 are a plurality of conductive layers formed on the rear surface of the semiconductor chip mounting substrate 11. Likewise, the plurality of wirings 18 is connected corresponding to the third group of conductive pads 14 and arranged and formed on the semiconductor chip mounting substrate 11. The wirings 18 are connected to corresponding wirings 20 formed on the rear surface of the semiconductor chip mounting substrate 11 via the plurality of through-hole conductors 19 piercing both sides of the semiconductor chip mounting substrate 11.

The rear surface of the semiconductor chip mounting substrate 11 has, e.g., a plurality of land grids correspondingly connected to the plurality of wirings 20, forming an external connection terminal group having the land grid array (LGA) structure.

The first, second, and third groups of conductive pads 12, 13, and 14, and the plurality of wirings 18 and 20, etc. on both surfaces of the substrate 11 are formed as follows. Copper foil is bonded on both surfaces of the semiconductor chip mounting substrate 11, is patterned, and then is plated with Au, etc. Normally, the resist film is formed on both surfaces of the semiconductor chip mounting substrate 11 for protecting the wirings 18 and 20.

As shown in FIGS. 2B or 3B, a semiconductor chip 22 is mounted by means of die bonding via adhesive 21 including paste, film, etc. in the two chip mounting areas 15 and 16 on the semiconductor chip mounting substrate 11.

FIGS. 2A and 2B are a plan view and a sectional view showing an example of a packaged semiconductor device by enlarging part of the section where the chip is mounted. In these figures, the semiconductor chip 22 is mounted in the larger chip mounting area 15 on the semiconductor chip mounting substrate 11 in FIG. 1.

The large-footprint semiconductor chip 22 is die bonded to the chip mounting area 15. Hence, around the semiconductor chip 22, there are positioned the first group of conductive pads 12 along the first side of the semiconductor chip mounting substrate 11 and the third group of conductive pads 14 along the second side. A plurality of bonding wires 24 connects a plurality of conductive pads 23 formed on the semiconductor chip 22 with the first and third group of conductive pads 12 and 14.

In this case, the second group of conductive pads 13 along the first side of the semiconductor chip mounting substrate 11 and part of the wiring 17 are hidden under the semiconductor chip 22.

FIGS. 3A and 3B are a plan view and a sectional view showing an example of a packaged semiconductor device by enlarging part of the section where the chip is mounted. In these figures, the semiconductor chip 22 is mounted on the other smaller chip mounting area 16 on the semiconductor chip mounting substrate 11 in FIG. 1.

The small-footprint semiconductor chip 22 is die bonded to the other chip mounting area 16. Hence, around the semiconductor chip 22, there are positioned the second group of conductive pads 13 along the first side of the semiconductor chip mounting substrate 11 and the third group of conductive pads 14 along the second side. The plurality of bonding wires 24 connects the plurality of conductive pads 23 formed on the semiconductor chip 22 with the second and third group of conductive pads 13 and 14.

In this case, the first group of conductive pads 12 along the first side of the semiconductor chip mounting substrate 11 and the wiring 17 are exposed without being hidden under the semiconductor chip 22.

Further, as shown in FIGS. 2B and 3B, an insulating resin 25 including, e.g., epoxy resin is used to seal the entire semiconductor chip mounting surface of the semiconductor chip mounting substrate 11 to cover the semiconductor chip 22, the bonding wire 24, etc. Then, the respective semiconductor devices are separated so as to maintain their external shapes. The insulating resin 25 need not always be formed to cover the entire surface, but may be applied to seal necessary portions. In such case, the insulating resin 25 needs to cover at least the semiconductor chip 22 and the bonding wire 24.

The chip mounting areas are not limited to two locations. Two or more chip mounting areas may be designed on the semiconductor chip mounting surface of the semiconductor chip mounting substrate 11.

The semiconductor chip mounting substrate 11 and the semiconductor device using the same according to the above-mentioned configuration can be used for any of a plurality of types of mountable semiconductor chips.

This eliminates the need to develop and design a new semiconductor chip mounting substrate according to a change in the type of mountable semiconductor chips. As a result, the efficiency of the semiconductor device development is not degraded remarkably. It is possible to restrict an increase in the types of semiconductor chip mounting substrates. There occurs no wasteful production line changeovers and management works, preventing manufacturing costs from increasing. A user can greatly benefit from the standardization of semiconductor chip mounting substrates.

As mentioned above, the first and second groups of conductive pads 12 and 13 are individually used for different types of semiconductor chips mountable on the chip mounting areas 15 and 16, and arranged along the first side of the semiconductor chip mounting substrate 11. The third group of conductive pads 14 is commonly used for different types of semiconductor chips mountable on the chip mounting areas 15 and 16, and is arranged along the second side of the semiconductor chip mounting substrate 11.

However, the first embodiment of the present invention is not limited thereto. It may be preferable to arrange part of the third group of conductive pads 14 so as to line up with the first or second group of conductive pads 12 or 13 along the first side of the semiconductor chip mounting substrate 11. As mentioned above, the third group of conductive pads 14 is commonly used for different types of semiconductor chips mountable on the chip mounting areas 15 and 16.

Figure 4:
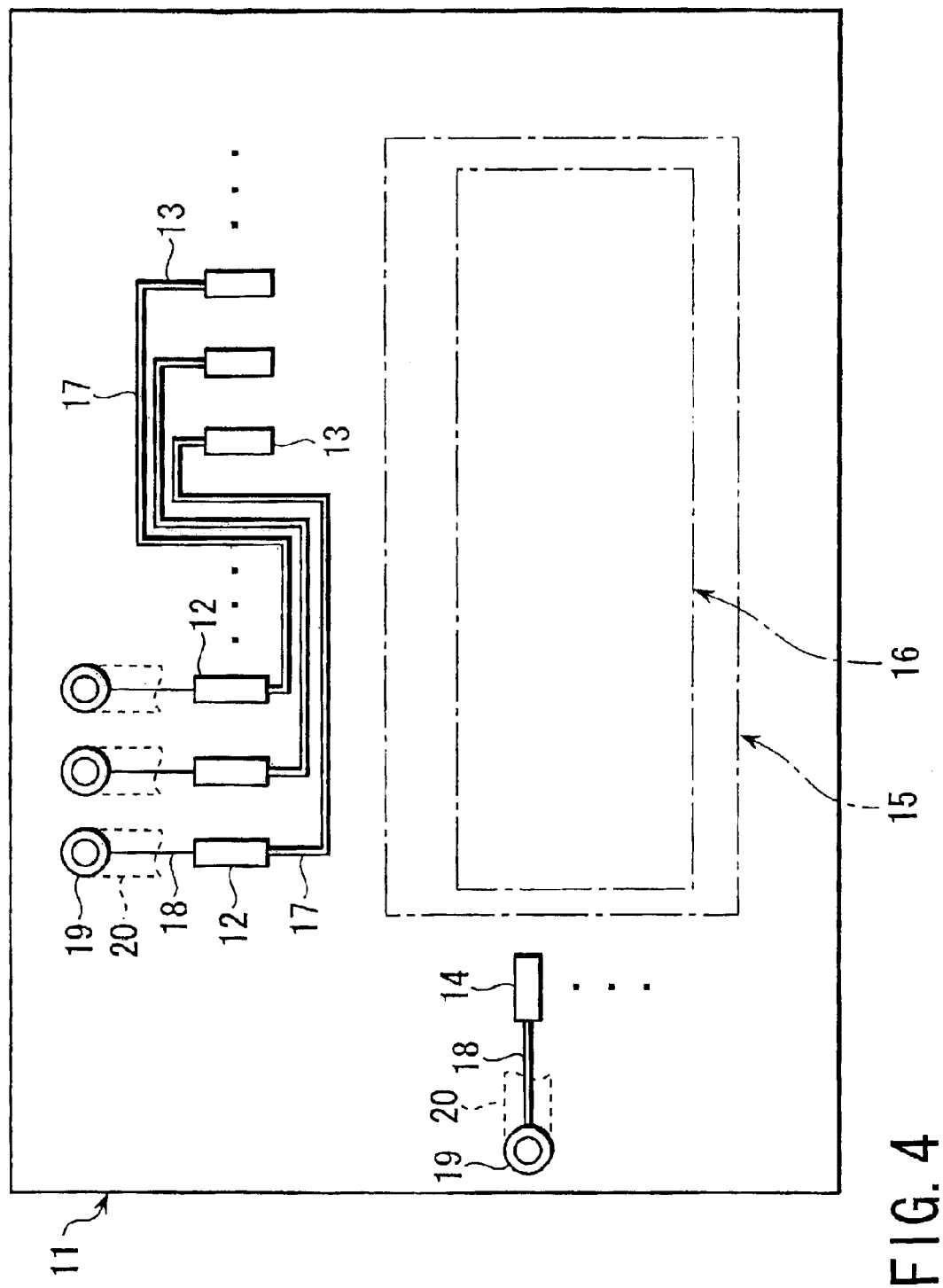
FIG. 4 is a plan view of a semiconductor chip mounting substrate according to a second embodiment of the present invention.

FIG. 4 is a plan view showing a pattern layout of part of a semiconductor chip mounting substrate according to the second embodiment of the present invention viewed from the chip mounting surface. The figures illustrate a packaged semiconductor device by mounting a semiconductor chip on the semiconductor chip mounting substrate.

The semiconductor chip mounting substrate 11 according to the embodiment differs from that according to the first embodiment in the placement state of the first, second, and third groups of conductive pads 12, 13, and 14. These groups of conductive pads are connected to conductive pads on the two types of semiconductor chips mountable in the two chip mounting areas 15 and 16 on the semiconductor chip mounting substrate 11. The mutually corresponding parts in FIGS. 4 and 1 are designated by the same reference numerals and a detailed description is omitted for simplicity.

Namely, the first group of conductive pads 12 is formed to the left of an area along the first side of the semiconductor chip mounting substrate 11, and arranged so as to correspond to part of an array of conductive pads on a semiconductor chip mountable on the chip mounting area 15, for example. The second group of conductive pads 13 is formed to the right of the area along the first side of the semiconductor chip mounting substrate 11, and arranged so as to correspond to part of an array of conductive pads on a semiconductor chip mountable on the other chip mounting area 16.

The first and second groups of conductive pads 12 and 13, which are formed in the area along the first side of the semiconductor chip mounting substrate 11, and contain a plurality of sets of conductive pads corresponding to the pads having the same capability in the two types of mountable semiconductor chips. Similarly to the case in FIG. 1, the conductive pads having the same capability in each set are connected to each other by means of the plurality of inter-pad wirings 17 formed on the chip mounting surface.

The effects similar to those for the first embodiment are available for a semiconductor device which mounts and packages the semiconductor chip, similarly to the first embodiment, on the semiconductor chip mounting substrate 11 having the above-mentioned configuration as shown in FIGS. 2A and 2B or 3A and 3B.

As mentioned above, the first and second groups of conductive pads 12 and 13 are individually used for different types of semiconductor chips mountable on the chip mounting areas 15 and 16, and are arranged along the first side of the semiconductor chip mounting substrate 11. The third group of conductive pads 14 is commonly used for different types of semiconductor chips mountable on the chip mounting areas 15 and 16, and is arranged along the second side of the semiconductor chip mounting substrate 11.

However, the second embodiment of the present invention is not limited thereto. It may be preferable to arrange part of the third group of conductive pads 14 so as to line up with the first or second group of conductive pads 12 or 13 along the first side of the semiconductor chip mounting substrate 11. As mentioned above, the third group of conductive pads 14 is commonly used for different types of semiconductor chips mountable on the chip mounting areas 15 and 16.

There has been described the semiconductor device according to the above-mentioned embodiments. The semiconductor chip is die bonded to the semiconductor chip mounting substrate 11. The bonding wire 24 interconnects the conductive pads on the semiconductor chip mounting substrate 11 and the semiconductor chip. The insulating resin 25 is used to seal the semiconductor chip mounting surface of the semiconductor chip mounting substrate 11 for packaging.

However, it is possible to provide a semiconductor device which mounts facedown the conductive pad formation surface on the semiconductor chip mounting substrate 11.

In this case, the first, second, and third groups of conductive pads 12, 13, and 14 on the semiconductor chip mounting substrate 11 should be, e.g., circular or square to be appropriate for bonding via solder bumps (to be described). A semiconductor chip is mounted with its pad formation surface facedown in the chip mounting area 15 or 16 on the semiconductor chip mounting substrate. At this time, conductive pads on the semiconductor chip mounting surface are bonded to those on the semiconductor chip via solder bumps. Further, adhesive is filled and is hardened between the semiconductor chip mounting substrate 11 and the semiconductor chip. An external connection terminal group of the land grid array structure is formed on the rear of the semiconductor chip mounting substrate 11.

The semiconductor device having such structure also provides the same effects as for the above-mentioned embodiments.

In the above-mentioned embodiments, there has been described the semiconductor device which forms an external connection terminal group with the land grid array structure including a plurality of land grids correspondingly connected to the plurality of wirings 20 on the rear of the semiconductor chip mounting substrate 11. It is also possible to use an external connection terminal group having the ball grid array structure to mount solder balls on respective land grids or other structures.

The third embodiment of the present invention will be described hereinafter.

Figure 5:
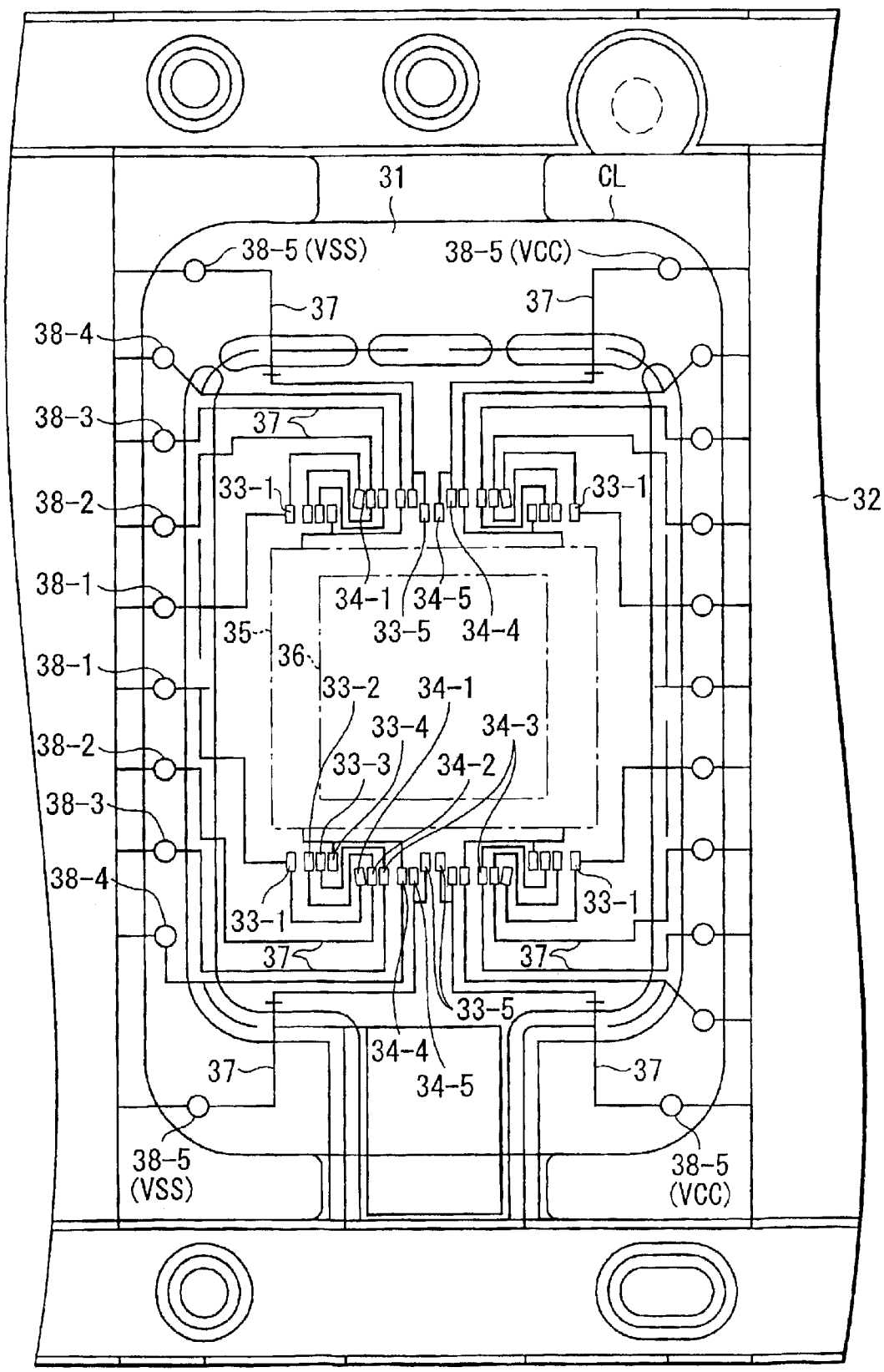
FIG. 5 is a plan view of a semiconductor chip mounting surface of a semiconductor chip mounting substrate according to a third embodiment of the present invention.
Figure 6:
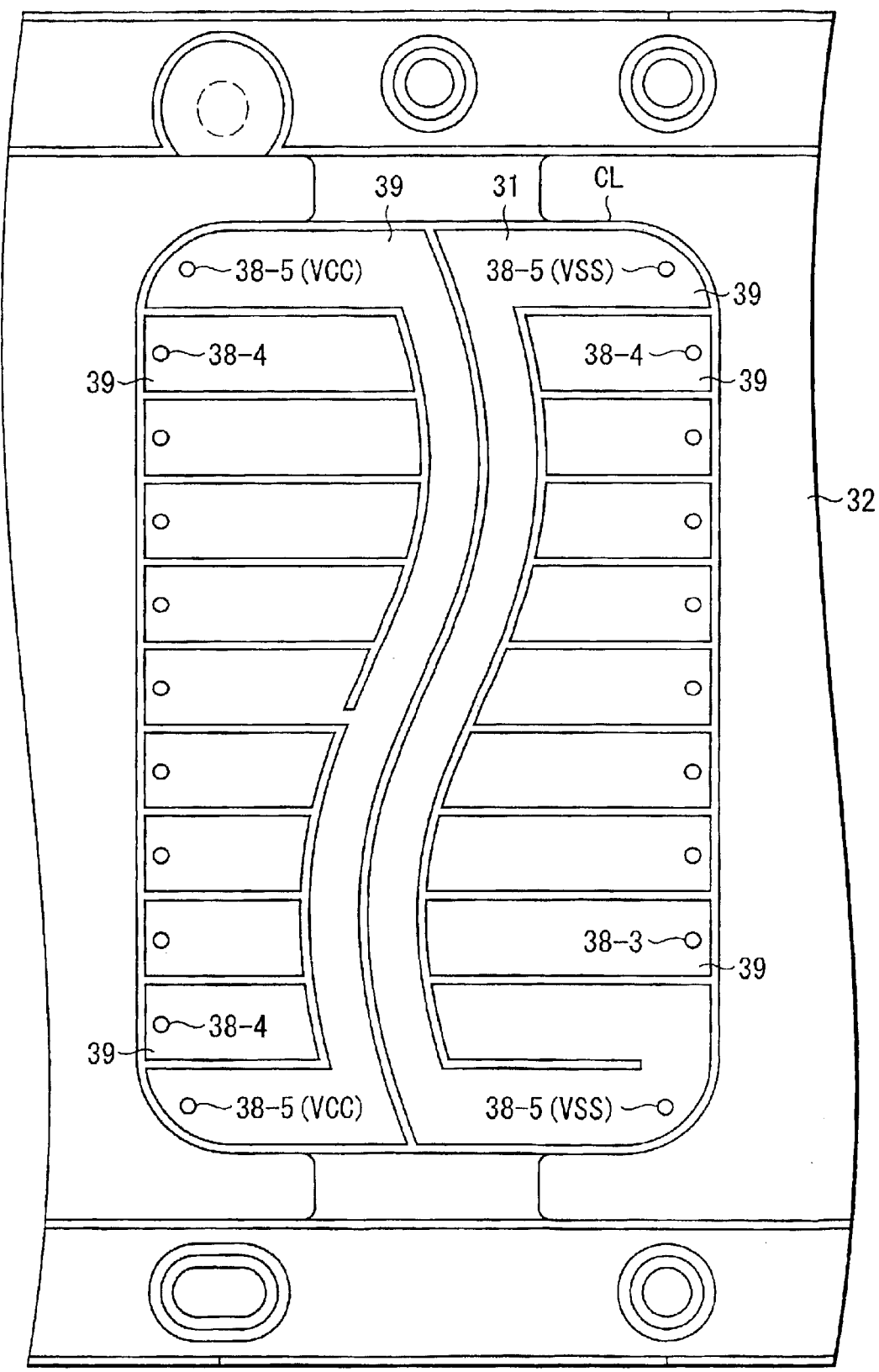
FIG. 6 is a plan view of the rear of the semiconductor chip mounting surface of the semiconductor chip mounting substrate according to the third embodiment of the present invention.

FIGS. 5 and 6 are plan views showing pattern layouts of a semiconductor chip mounting substrate according to the third embodiment of the present invention viewed from the semiconductor chip mounting surface and its rear surface. The embodiment provides an example of the present invention embodied on a memory card called a SmartMedia (registered trademark) card.

A semiconductor chip mounting substrate (wiring substrate) 31 is separately divided by cutting a long insulated substrate 32 formed of, e.g., synthetic resin as a base material to a portion indicated by CL (solid line in FIG. 5). The divided semiconductor chip mounting substrate 31 is almost rectangular and has the size of approximately 17 mm×28 mm, for example. There are formed four sets of first and second groups of conductive pads 33-1 through 33-5 and 34-1 through 34-5, respectively, on one side of the semiconductor chip mounting substrate 31, i.e., the semiconductor chip mounting surface. Each group includes a plurality of conductive pads arranged in a row. Each of the conductive pads 33-1 through 33-5 and 34-1 through 34-5 is rectangular.

The semiconductor chip mounting substrate 31 is provided with two chip mounting areas 35 and 36 for mounting two types of NAND flash memory chips with different chip sizes. The chip mounting areas 35 and 36 partially overlap with each other on the semiconductor chip mounting substrate 31.

The chip mounting area 35 is used to mount a NAND flash memory chip before it is shrunk. The NAND flash memory chip before being shrunk has the size of 8 mm×10 mm, for example. The other chip mounting area 36 is used to mount a shrunk NAND flash memory chip having the same function and storage capacity as for the NAND flash memory chip before being shrunk. The shrunk NAND flash memory chip has the size of 7 mm×9 mm, for example.

Two sets of the first and second groups of conductive pads 33-1 through 33-5 and 34-1 through 34-5 are symmetrically arranged along the first side of the chip mounting areas 35 and 36. The remaining two sets are symmetrically arranged along the second side parallel to the first side. Of the first and second groups of conductive pads, four sets of the first group of conductive pads 33-1 through 33-5 are connected to conductive pads on a large-size memory chip mountable on the large-footprint chip mounting area 35. Two sets of conductive pads 33-1 through 33-5 are symmetrically arranged along the first and second sides of the chip mounting area 35.

Of the first and second groups of conductive pads, four sets of the second group of conductive pads 34-1 through 34-5 are connected to conductive pads on a small-size memory chip mountable on the small-footprint chip mounting area 36. Two of four sets of conductive pads 34-1 through 34-5 are also symmetrically arranged along the first and second sides of the chip mounting area 36.

The number of pads and the placement state thereof are determined for the first and second groups of conductive pads 33-1 through 33-5 and 34-1 through 34-5 so as to correspond to the pad arrangements on the two types of memory chips with different chip sizes mountable on the chip mounting areas 35 and 36 of the semiconductor chip mounting substrate 31. Accordingly, the total number of the first and second groups of conductive pads 33-1 through 33-5 and 34-1 through 34-5 is larger than the total number of pads on any one of the two types of mountable memory chips.

The first and second groups of conductive pads 33-1 through 33-5 and 34-1 through 34-5 include a plurality of sets of conductive pads corresponding to pads having the same function on the two types of memory chips mountable on the chip mounting areas 35 and 36. Of the four sets of conductive pads 33-1 through 33-5 and 34-1 through 34-5, conductive pads having the same function in each group are interconnected via a plurality of inter-pad wirings 37 formed on the chip mounting surface. Namely, the inter-pad wirings 37 interconnect four sets of the conductive pads 33-1 through 33-5 and 34-1 through 34-5 with each other in each group.

The plurality of wirings 37 are arranged and formed on the semiconductor chip mounting substrate 31. The wirings 37 pass a plurality of through-hole conductors 38 piercing both surfaces of the semiconductor chip mounting substrate 31, and are correspondingly connected to a plurality of external connection terminal groups 39, namely, a plurality of flat conductive layers formed on the rear of the semiconductor chip mounting substrate 31 as shown in FIG. 6. There are provided four sets of through-hole conductors 38. Each set includes five conductors 38-1 through 38-5 corresponding to the first and second groups of conductive pads 33-1 through 33-5 and 34-1 through 34-5. The through-hole conductors 38-1 through 38-5 in each set are correspondingly connected to the first and second groups of conductive pads 33-1 through 33-5 and 34-1 through 34-5. Namely, the inter-pad wirings 37 interconnect four sets of the conductive pads 33-1 through 33-5 and 34-1 through 34-5, and the through-hole conductors 38-1 through 38-5 correspondingly with each other.

Here, each set of four conductive pads, i.e., 33-1 through 33-4 and 34-1 through 34-4 are arranged in the same manner in the plurality of groups.

The first and second groups of conductive pads 33-1 through 33-5, 34-1 through 34-5, the plurality of wirings 37, the plurality of external connection terminal groups 39 on the rear of the substrate, etc. are formed as follows. Copper foil is bonded on both surfaces of the insulated substrate 32 constituting the semiconductor chip mounting substrate 31, is patterned, and then is plated with Au, etc. Normally, the resist film is formed on both surfaces of the semiconductor chip mounting substrate 31 for protecting the wirings 37, etc.

While there are four sets of the through-hole conductors 38-1 through 38-5, each set contains one through-hole conductor 38-5, i.e., four in total. The four through-hole conductors 38-5 each are provided at four corners of the semiconductor chip mounting substrate 31. The through-hole conductors 38-5 are used to supply the power supply potential (VCC) and the ground potential (VSS) to semiconductor chips mountable on the chip mounting areas 35 and 36. The inter-pad wirings 37 connected to each through-hole conductor 38-5, for minimizing the wiring resistance, are branched to the conductive pads 33-5 and 34-5, i.e., to the respective chip mounting areas in the middle of a path from each through-hole conductor 38-5 to the conductive pads 33-5 and 34-5 in the corresponding first and second groups.

Except the through-hole conductor 38-5, the through-hole conductors 38-1 through 38-4 transmit signals. The inter-pad wirings 37 connected to the through-hole conductors 38-1 through 38-4 are respectively connected to the first and second groups of conductive pads 33-1 through 33-4 and 34-1 through 34-4 having the same function.

Similarly to the case in FIGS. 2B or 3B, the semiconductor chips 22, i.e., the memory chips are die bonded to the two chip mounting areas 35 and 36 on the semiconductor chip mounting substrate 31 via the adhesive 21 including paste or film. The bonding wires 24 connect the conductive pads on the semiconductor chip mounting substrate 31 and on the semiconductor chip 22 with each other. The insulating resin 25 seals the chip mounting surface of the semiconductor chip mounting substrate 31. Thereafter, as mentioned above, the semiconductor chip mounting substrate 31 is cut to the portion indicated by the solid-line CL in FIG. 5 to separately complete the semiconductor device.

Figure 7:
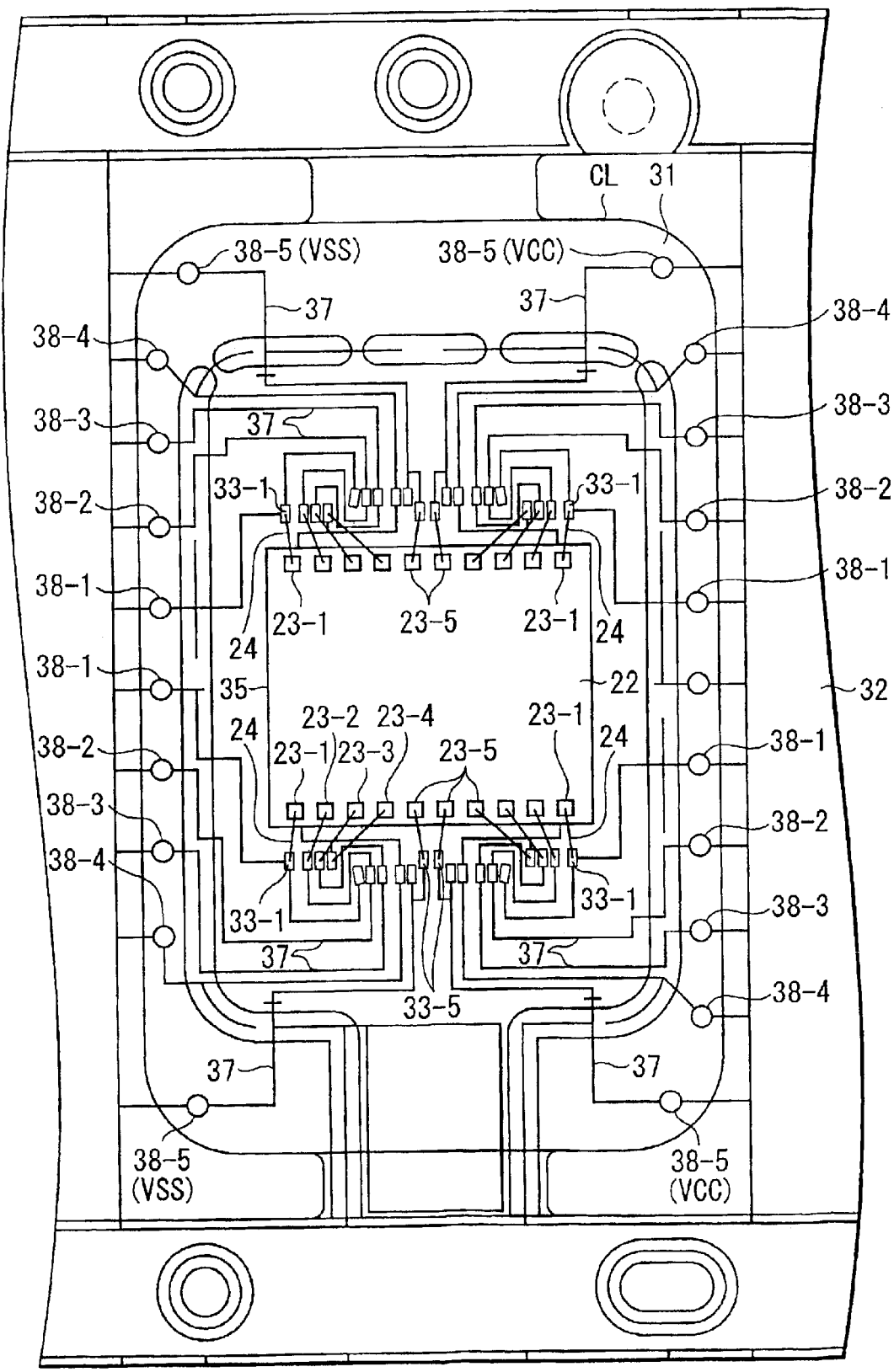
FIG. 7 is a plan view showing that a type of semiconductor chip is mounted on a chip mounting area of the semiconductor chip mounting substrate in FIG. 5.
Figure 8:
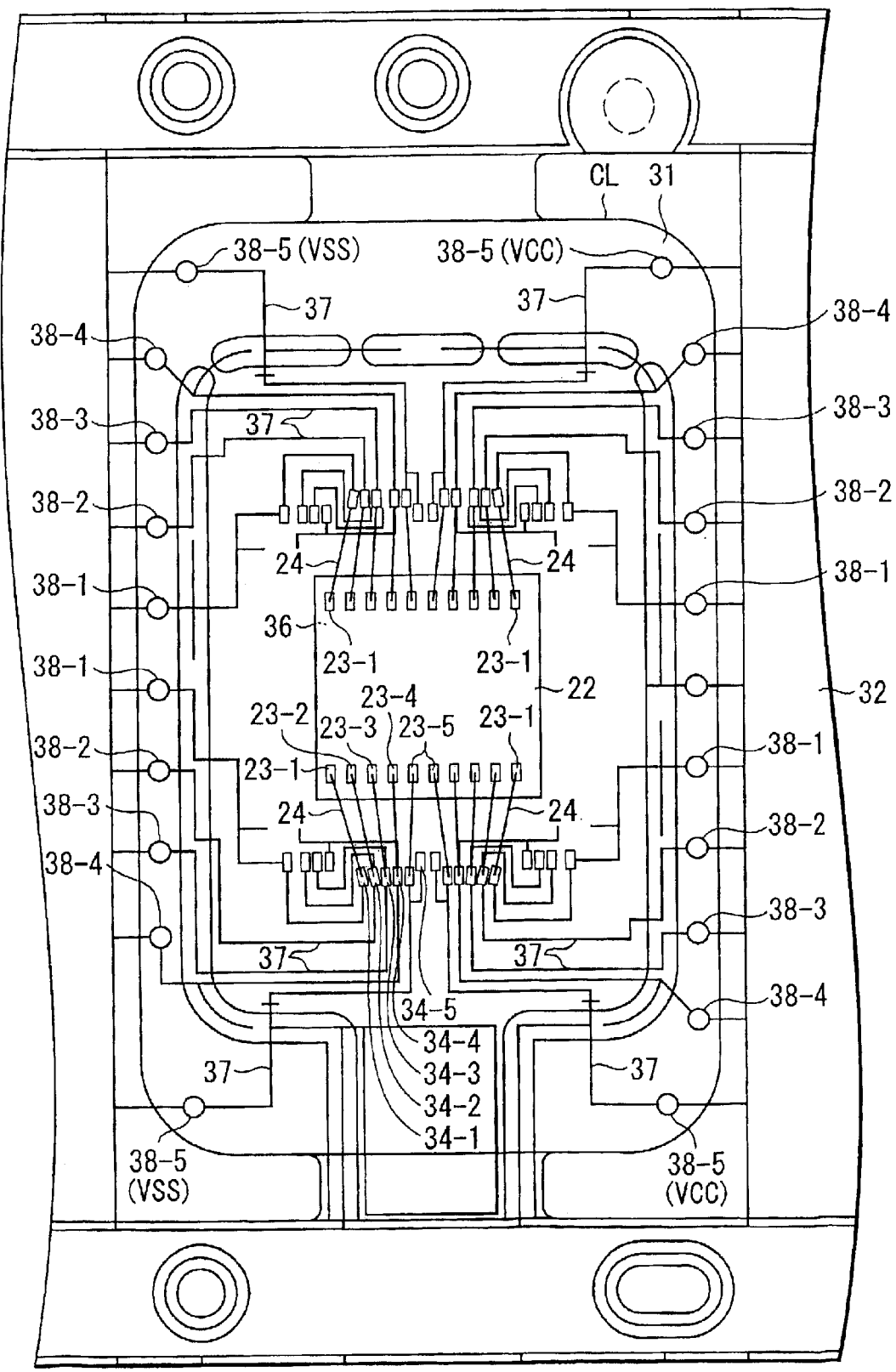
FIG. 8 is a plan view showing that a semiconductor chip of a type different from that in FIG. 7 is mounted on a chip mounting area of the semiconductor chip mounting substrate in FIG. 5.

FIG. 7 shows that the semiconductor chip 22 is mounted on the chip mounting area 35 of the semiconductor chip mounting substrate 31. The bonding wires 24 connect four sets of the conductive pads 33-1 through 33-5 on the semiconductor chip mounting substrate 31 with four sets of the corresponding conductive pads 23-1 through 23-5 on the semiconductor chip 22. Similarly, FIG. 8 shows that the semiconductor chip 22 is mounted on the chip mounting area 36 of the semiconductor chip mounting substrate 31. The bonding wires 24 connect four sets of the conductive pads 34-1 through 34-5 on the semiconductor chip mounting substrate 31 with four sets of the corresponding conductive pads 23-1 through 23-5 on the semiconductor chip 22. Thereafter, the insulating resin 25 seals the chip mounting surface including the both.

Figure 9:
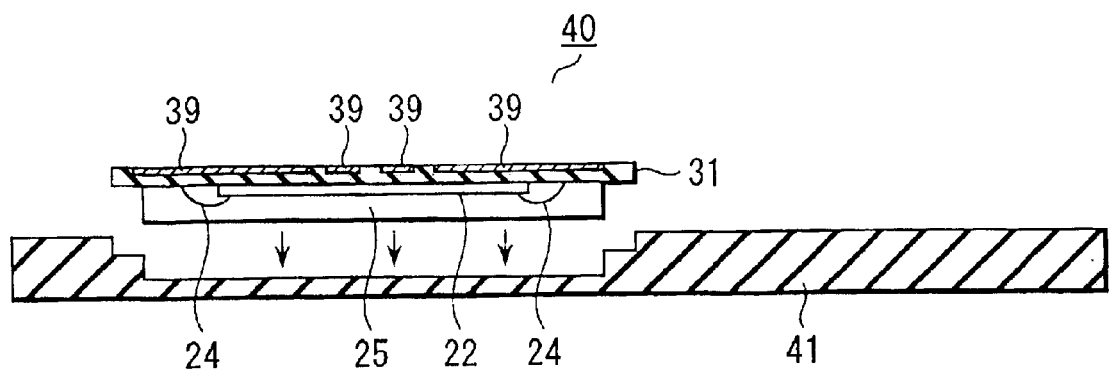
FIG. 9 is a sectional view showing a semiconductor device using the semiconductor chip mounting substrate shown in FIGS. 5 and 6 and a base card for containing the device.
Figure 10:
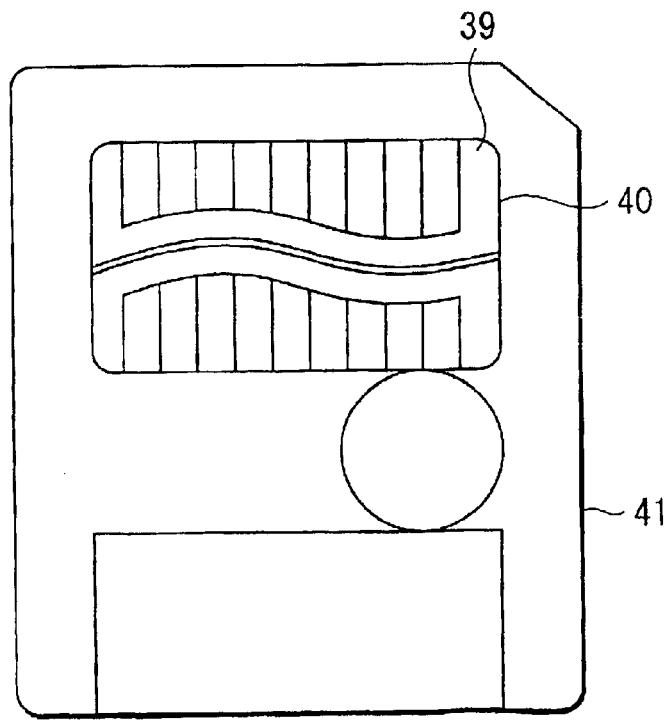
FIG. 10 is a plan view of a SmartMedia card configured by assembling the semiconductor device and the base card as shown in FIG. 9.

FIG. 9 is a sectional view showing a semiconductor device 40 configured as described above and a card substrate called a base card for containing the semiconductor device 40. As shown in FIG. 9, the semiconductor device 40 contains the semiconductor chip 22 mounted on the semiconductor chip mounting substrate 31. The semiconductor device 40 is inserted into a recess in the card substrate 41, is bonded, and is assembled to complete a SmartMedia card having the top view in FIG. 10.

The semiconductor device having such structure also provides the same effects as for the above-mentioned embodiments.

Figure 11:
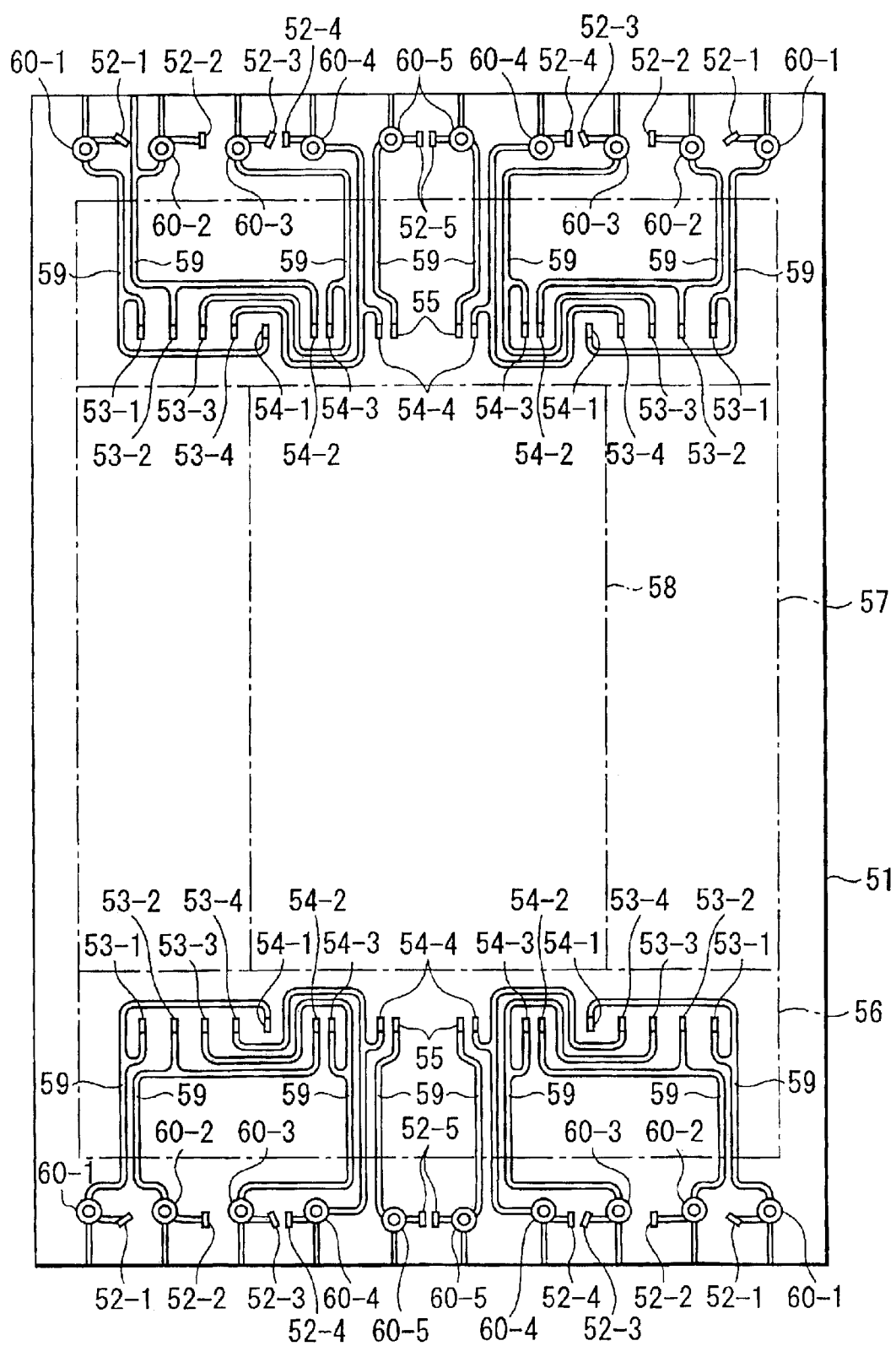
FIG. 11 is a plan view of a semiconductor chip mounting substrate according to a fourth embodiment of the present invention.

A fourth embodiment of the present invention will be described hereinafter. FIG. 11 is a plan view showing a pattern layout of a semiconductor chip mounting substrate according to the fourth embodiment of the present invention viewed from the chip mounting surface.

A semiconductor chip mounting substrate 51 is configured by separately cutting a long insulated substrate formed of, e.g., synthetic resin as a base material. The semiconductor chip mounting substrate 51 is rectangular and has the size of approximately 12 mm×18 mm, for example. There are formed four sets of a first group of conductive pads 52-1 through 52-5, a second group of conductive pads 53-1 through 53-4, a third group of conductive pads 54-1 through 54-4, and one conductive pad 55 on one side of the semiconductor chip mounting substrate 51, i.e., the chip mounting surface. The plurality of conductive pads in each group are arranged in a row. Each of the conductive pads 52-1 through 52-5, 53-1 through 53-4, 54-1 through 54-4, and 55 is rectangular.

The semiconductor chip mounting substrate 51 is provided with three chip mounting areas 56, 57, and 58 for mounting three types of NAND flash memory chips having different storage capacities and chip sizes. The chip mounting areas 56, 57, and 58 partially overlap with each other on the semiconductor chip mounting substrate 51.

The chip mounting area 56 can mount a NAND flash memory chip having a largest storage capacity, e.g., 512 Mbits of the three types of NAND flash memory chips. The flash memory chip having the largest storage capacity is sized, e.g., 9 mm×15 mm. The chip mounting area 57 can mount a NAND flash memory chip having a next largest storage capacity, e.g., 256 Mbits of the three types of NAND flash memory chips. The flash memory chip having the next largest storage capacity is sized, e.g., 9 mm×10 mm. The chip mounting area 58 can mount a NAND flash memory chip having a smallest storage capacity, e.g., 128 Mbits of the three types of NAND flash memory chips. The flash memory chip having the smallest storage capacity is sized, e.g., 7 mm×9 mm.

Two sets of the first, second, and third groups of conductive pads 52-1 through 52-5, 53-1 through 53-4, 54-1 through 54-4, and the conductive pad 55 are symmetrically arranged along a first side of the three chip mounting areas 56, 57, and 58. The remaining two sets thereof are symmetrically arranged along a second side parallel to the first side.

Four sets of the first group of conductive pads 52-1 through 52-5 are connected to the conductive pads on the largest flash memory chip mountable on the chip mounting area 56 having the largest foot print.

Four sets of the second group of conductive pads 53-1 through 53-4 and the conductive pad 55 are connected to the conductive pads on the next largest flash memory chip mountable on the chip mounting area 57 having the next largest foot print. Like the first group of conductive pads, the four sets of the conductive pads 53-1 through 53-4 are symmetrically arranged along the first and second sides of the chip mounting area 57.

Four sets of the third group of conductive pads 54-1 through 54-4 and the conductive pad 55 are connected to the conductive pads on the smallest flash memory chip mountable in the chip mounting area 58 having the smallest foot print. Like the first group of conductive pads, the four sets of the conductive pads 54-1 through 54-4 are also symmetrically arranged along the first and second sides of the chip mounting area 58.

Each of the four conductive pads 55 in each set is arranged adjacently to the conductive pad 54-4 in the corresponding set.

The number of pads and the placement state thereof are determined for the first, second, and third groups of conductive pads 52-1 through 52-5, 53-1 through 53-4, 54-1 through 54-4, and the conductive pad 55 so as to correspond to the pad arrangements on the three types of flash memory chips having different chip sizes mountable on the three chip mounting areas 56, 57, and 58 on the semiconductor chip mounting substrate 51. Accordingly, the total number of the first, second, and third groups of conductive pads 52-1 through 52-5, 53-1 through 53-4, 54-1 through 54-4, and the conductive pad 55 is larger than the total number of pads on any one of the three types of mountable flash memory chips. Each conductive pad 55 in the four sets is commonly used for the two types of flash memory chips with different chip sizes mountable in the two chip mounting areas 57 and 58. In this case, the semiconductor chip mounting substrate 51 contains 10 conductive pads connected to each of the three type of flash memory chips.

The first, second, and third groups of conductive pads 52-1 through 52-5, 53-1 through 53-4, 54-1 through 54-4, and the conductive pad 55 include a plurality of sets of conductive pads corresponding to pads having the same function on the three types of memory chips mountable in the chip mounting areas 56, 57, and 58. The conductive pads having the same function in each set are interconnected via a plurality of inter-pad wirings 59 formed on the chip mounting surface. Namely, the inter-pad wirings 59 interconnect the four conductive pads 52-1 through 52-4, the four conductive pads 53-1 through 53-4, and the four conductive pads 54-1 through 54-4 in the four sets of each group of conductive pads. Further, the inter-pad wirings 59 interconnect the first group of conductive pads 52-5 with the second and third groups of conductive pads 55.

The plurality of wirings 59 are arranged and formed on the semiconductor chip mounting substrate 51. The wirings 59 pass a plurality of through-hole conductors 60 piercing both surfaces of the semiconductor chip mounting substrate 51. The wirings 59 are correspondingly connected to a plurality of external connection terminal groups, namely, a plurality of conductive layers formed on the rear of the semiconductor chip mounting substrate 51 similarly to the wirings 20 in FIG. 1.

There are provided four sets of through-hole conductors 60. Each set includes five conductors 60-1 through 60-5 corresponding to the first and second groups of conductive pads 33-1 through 33-5 and 34-1 through 34-5. The through-hole conductors 60-1 through 60-5 in each set are correspondingly connected to the first, second and third groups of conductive pads 52-1 through 52-5, 53-1 through 53-4, 54-1 through 54-4 and 55. Namely, the inter-pad wirings 59 interconnect four sets of the conductive pads 52-1 through 52-5, 53-1 through 53-4, 54-1 through 54-4 and 55, and the through-hole conductors 60-1 through 60-5 correspondingly with each other.

Here, each set of four conductive pads, i.e., 52-1 through 52-4, 53-1 through 53-4, and 54-1 through 54-4 are arranged in the same manner in the plurality of groups.

Of the four sets of the through-hole conductors 60-1 through 60-5, the four through-hole conductors 60-5 are centered widthwise on the semiconductor chip mounting substrate 51. The four through-hole conductors 60-5 supply the power supply potential (VCC) or the ground potential (VSS) to semiconductor chips mountable on the chip mounting areas 56, 57, and 58. For minimizing the wiring resistance, the inter-pad wirings 59 connected to the through-hole conductors 60-1 through 60-5 are branched to the conductive pads in each group, i.e., to the respective chip mounting areas in the middle of paths from the through-hole conductors 60-1 through 60-5 to the conductive pads in the corresponding first, second, and third groups.

The first, second, and third groups of conductive pads, the plurality of wirings 59, the plurality of external connection terminal groups on the rear of the substrate, etc. are formed as follows. Copper foil is bonded to both surfaces of the insulated substrate constituting the semiconductor chip mounting substrate 51, is patterned, and then is plated with Au, etc. Normally, the resist film is formed on both surfaces of the semiconductor chip mounting substrate 51 for protecting the wirings 59, etc.

Figure 12:
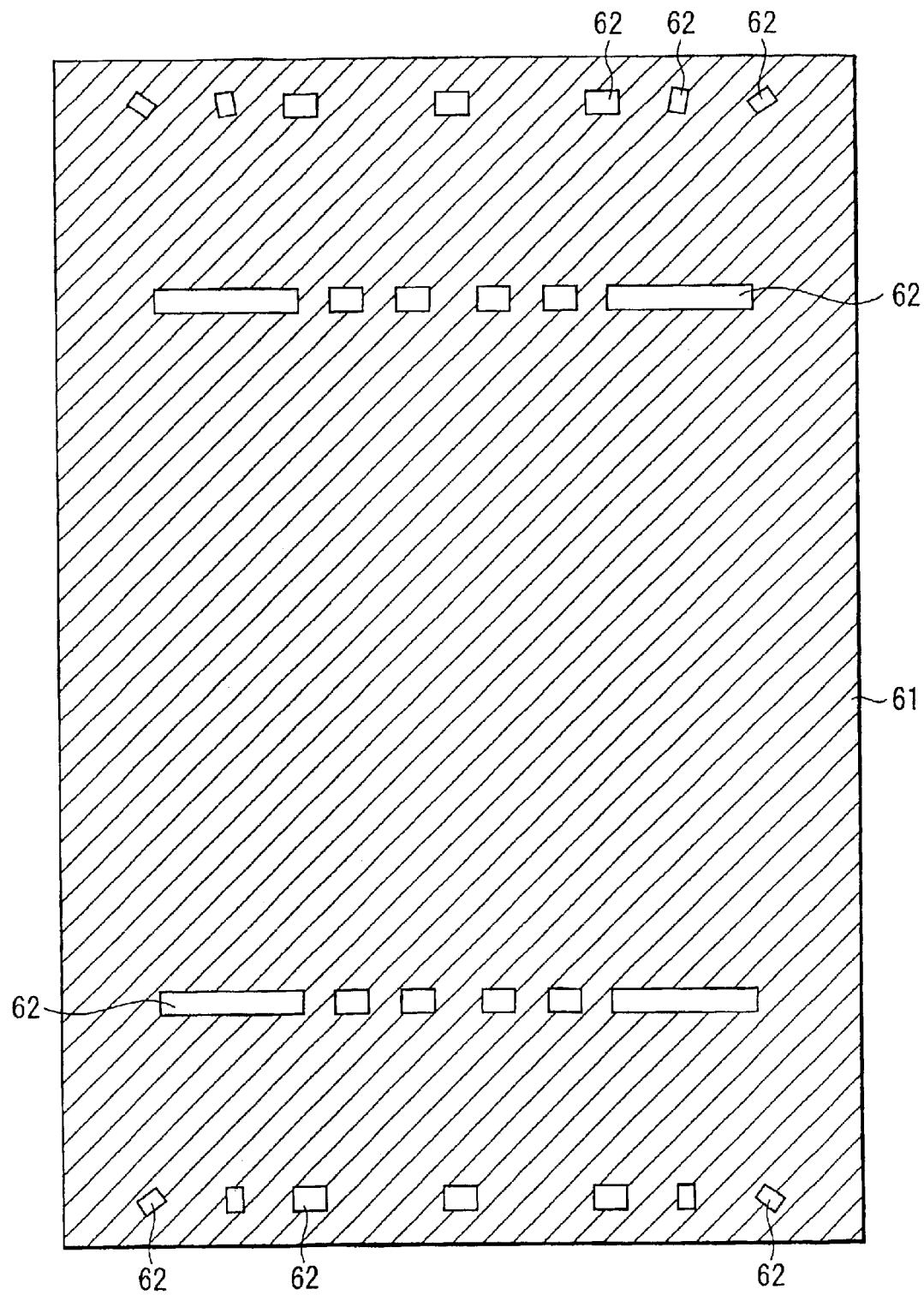
FIG. 12 is a plan view showing a pattern example of resist film formed on the semiconductor chip mounting surface of the semiconductor chip mounting substrate in FIG. 11.

FIG. 12 shows a pattern example of a resist film 61 formed on the semiconductor chip mounting surface of the semiconductor chip mounting substrate 51 in FIG. 11. The resist film 61 is insulative. If the resist film 61 is formed overall on the semiconductor chip mounting substrate 51, it is impossible to electrically connect the conductive pads on the semiconductor chip mounting substrate 51 with conductive pads on the flash memory chip mounted on the semiconductor chip mounting substrate 51.

As shown in FIG. 12, there is provided a plurality of apertures 62 with no resist applied where the conductive pads 52-1 through 52-5, 53-1 through 53-5, 54-1 through 54-5, and 55 are formed. Some of apertures 62 are formed correspondingly to one conductive pad on the semiconductor chip mounting substrate 51. The other apertures 62 are formed correspondingly to a plurality of conductive pads on the semiconductor chip mounting substrate 51. Of the apertures 62, the smallest one has an area of 0.5 mm×0.35 mm=0.175 mm². The largest one has an area of 2.13 mm×0.35 mm=0.7455 mm².

Similarly to the case in FIGS. 2B or 3B, the semiconductor chips 22, i.e., the flash memory chips are die bonded to the three chip mounting areas 56, 57, and 58 on the semiconductor chip mounting substrate 51 via the adhesive 21 including paste or film. The bonding wires 24 connect the conductive pads on the semiconductor chip mounting substrate 51 and on the semiconductor chip 22 with each other. The insulating resin 25 seals the chip mounting surface of the semiconductor chip mounting substrate 51 to complete the semiconductor device.

Figure 13:
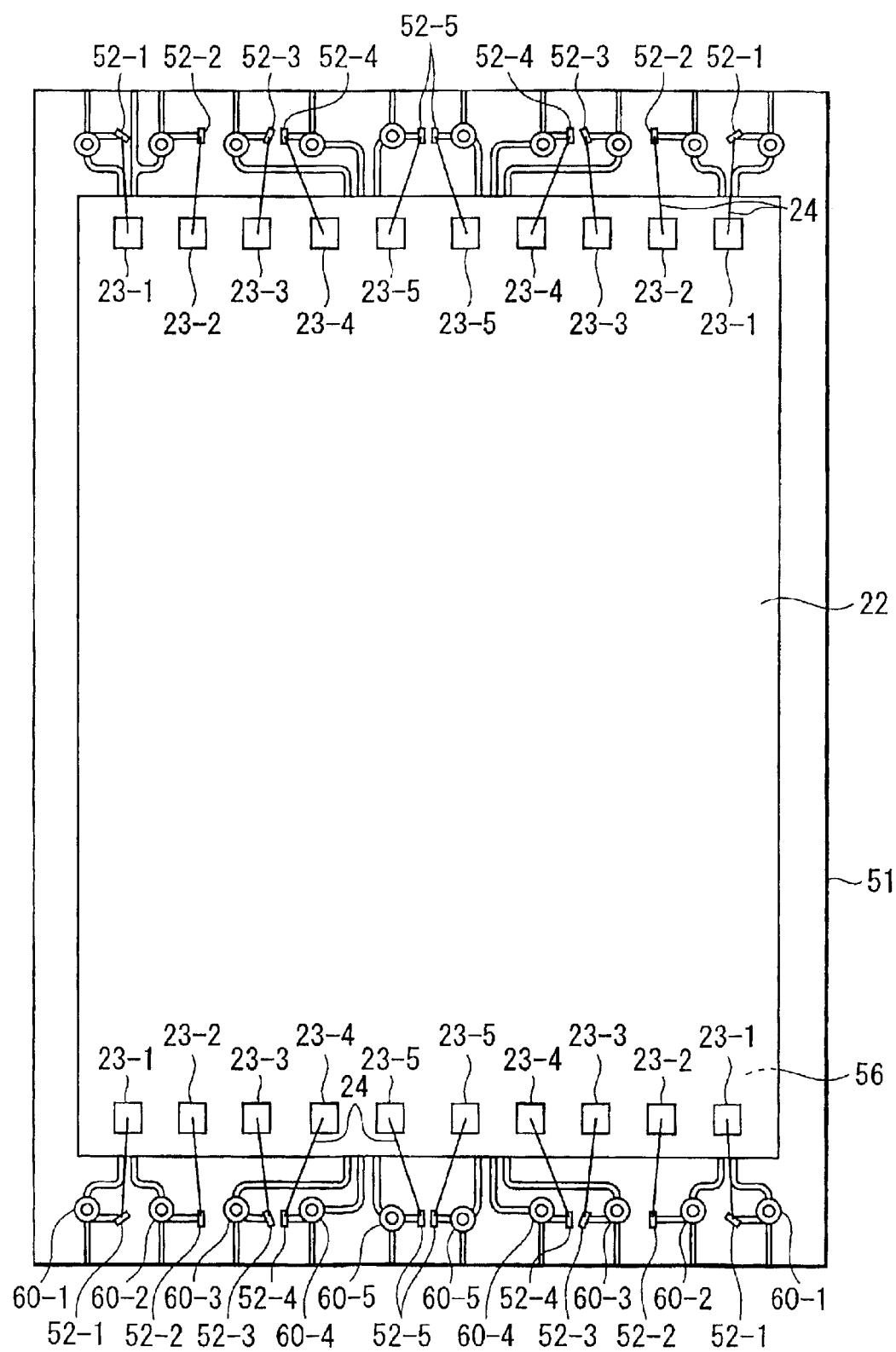
FIG. 13 is a plan view showing that a type of semiconductor chip is mounted on a chip mounting area of the semiconductor chip mounting substrate in FIG. 11.
Figure 14:
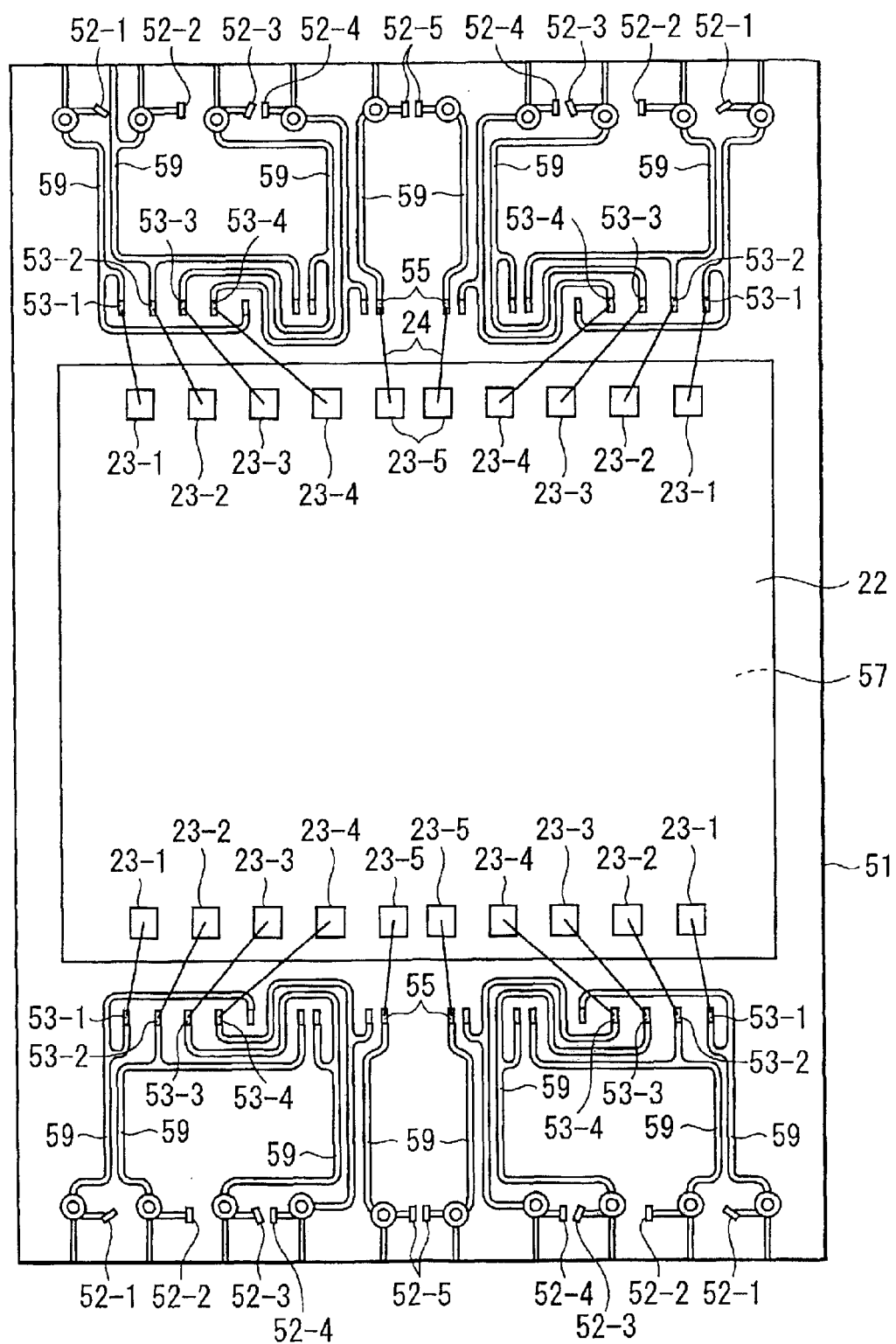
FIG. 14 is a plan view showing that a semiconductor chip of a type different from that in FIG. 13 is mounted on a chip mounting area of the semiconductor chip mounting substrate in FIG. 11.
Figure 15:
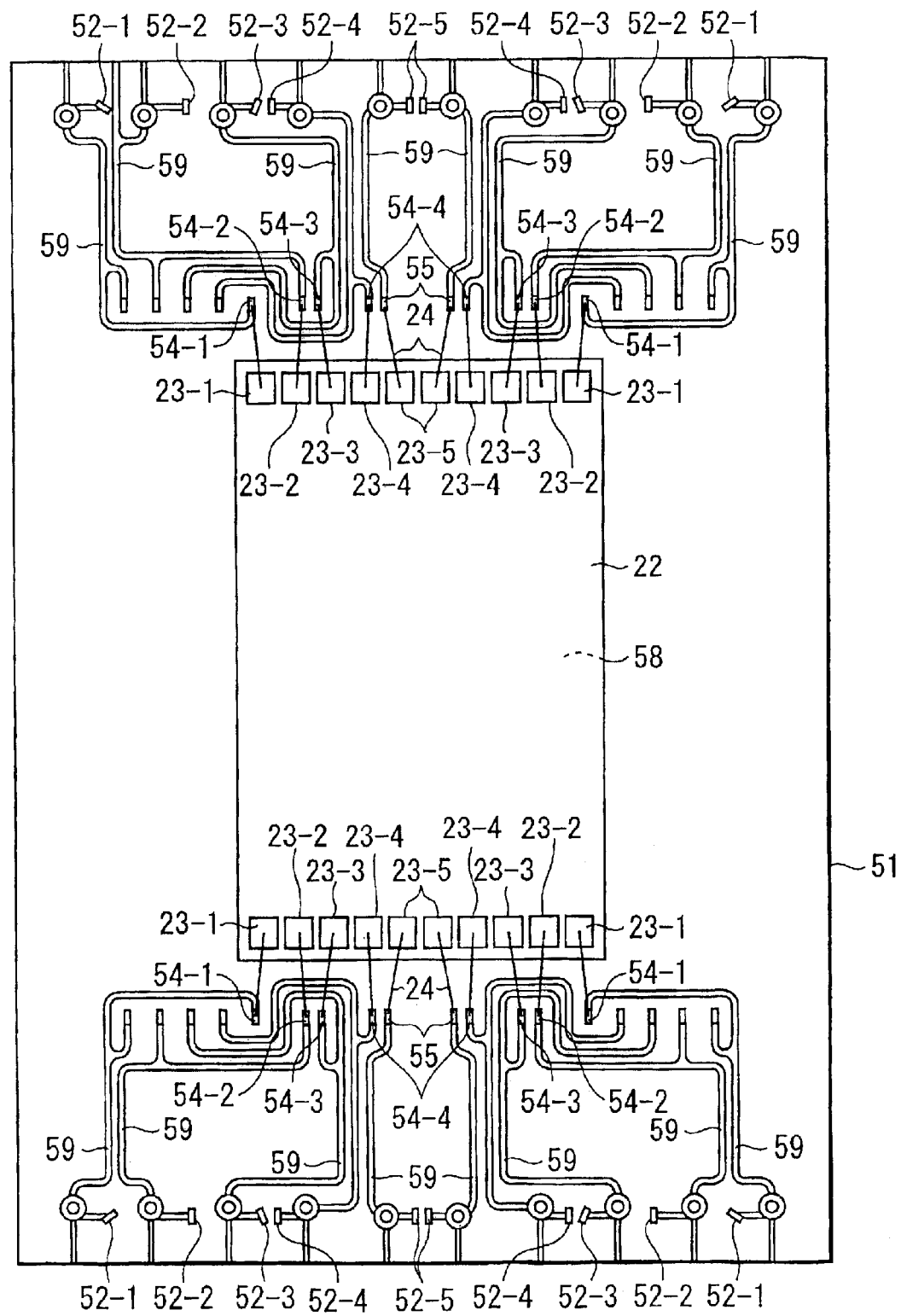
FIG. 15 is a plan view showing that a semiconductor chip of a type different from those in FIGS. 13 and 14 is mounted on a chip mounting area of the semiconductor chip mounting substrate in FIG. 11.

FIG. 13 shows that the largest semiconductor chip 22 is mounted on the chip mounting area 56 of the semiconductor chip mounting substrate 51. The bonding wires 24 connect four sets of the conductive pads 52-1 through 52-5 on the semiconductor chip mounting substrate 51 with four sets of the corresponding conductive pads 23-1 through 23-5 on the semiconductor chip 22. Similarly, FIG. 14 shows that the next largest semiconductor chip 22 is mounted on the chip mounting area 57 of the semiconductor chip mounting substrate 51. The bonding wires 24 connect four sets of the conductive pads 53-1 through 53-4, and 55 on the semiconductor chip mounting substrate 51 with four sets of the corresponding conductive pads 23-1 through 23-5 on the semiconductor chip 22. Further, FIG. 15 shows that the smallest semiconductor chip 22 is mounted on the chip mounting area S8 of the semiconductor chip mounting substrate 51. The bonding wires 24 connect four sets of the conductive pads 54-1 through 54-4, and 55 on the semiconductor chip mounting substrate 51 with four sets of the corresponding conductive pads 23-1 through 23-5 on the semiconductor chip 22. After the bonding wires 24 have been connected, the insulated resin 25 seals the chip mounting surface.

The chip mounting area 56 is largest of the three chip mounting areas 56, 57, and 58 on the semiconductor chip mounting substrate 51 in FIG. 11. When the flash memory chip is mounted on the chip mounting area 56, the flash memory chip covers some of the apertures 62 formed on the resist film 61 as shown in FIG. 12.

Figure 16:
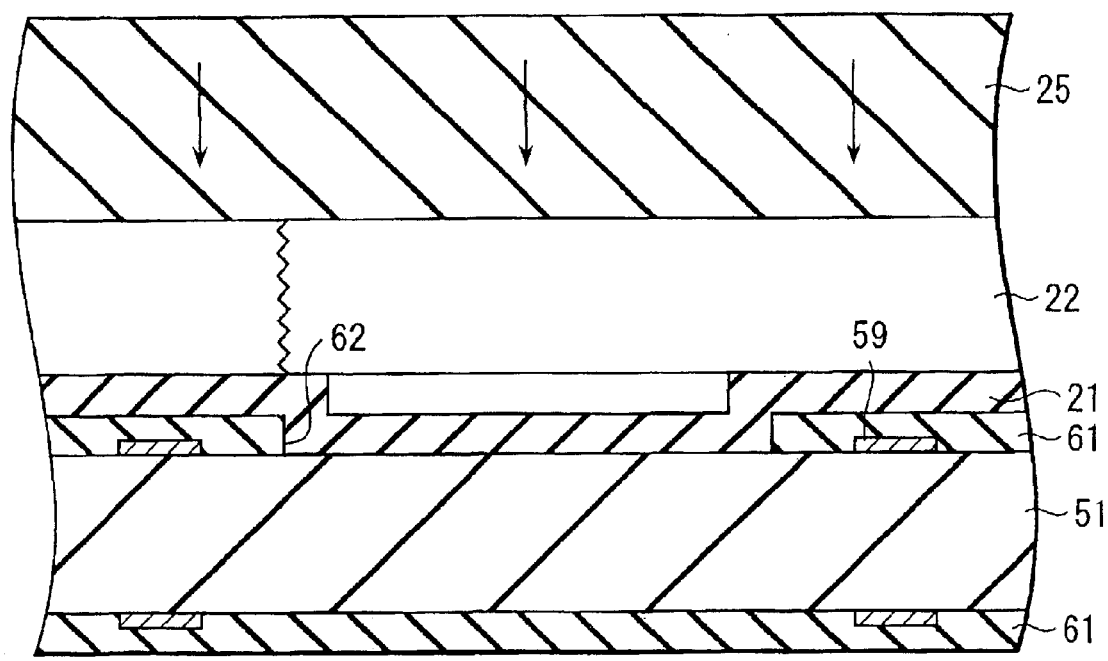
FIG. 16 is a sectional view showing a process for resin sealing on the semiconductor chip mounting substrate in FIG. 11.

FIG. 16 is a sectional view showing that the semiconductor chip 22 is mounted on the chip mounting area 56 on the semiconductor chip mounting substrate 51 via the adhesive 21, and then the insulated resin 25 for sealing is formed.

As mentioned above, the large semiconductor chip 22 is mounted on the chip mounting area 56 having the largest foot print, and then is sealed by the resin. At this time, if the aperture 62 of the resist film 61 is positioned to the bottom of the semiconductor chip 22, the semiconductor chip 22 may be cracked at the edge of the aperture 62 due to the pressure generated by movement of the sealing resin. The semiconductor chip 22 is assumed to be, e.g., 250 $\mu$m or less in thickness. The resist film 61 is assumed to be, e.g., 20 $\mu$m or more in thickness.

In such a situation, the inventors conducted various inspections to find that no cracks occur on the semiconductor chip 22 by setting an area of 1 mm$^2$ or smaller for the aperture 62 of the resist film 61 positioned to the bottom of the semiconductor chip 22. Of the apertures 62 in the resist film 61 in FIG. 12, the largest one has an area of 0.7455 mm$^2$. Accordingly, no cracks occur on the semiconductor chip 22 if it is mounted and the insulated resin 25 is formed on the semiconductor chip mounting substrate 51.

The semiconductor device according to the fourth embodiment can also provide the same effects as for the above-mentioned embodiments. Further, there is provided an additional effect of preventing a crack from occurring on the semiconductor chip due to a step on the substrate even if the semiconductor chip is mounted with the wirings positioned to the bottom.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an insulated substrate having a semiconductor chip mounting surface which provides a plurality of partially overlapping chip mounting areas;
   a plurality of conductive pads in a plurality of groups formed on said insulated substrate corresponding to semiconductor chips mountable on said plurality of chip mounting areas;
   a semiconductor chip which is mounted on one of said plurality of chip mounting areas, said semiconductor chip having a plurality of conductive pads on the top surface;
   a plurality of bonding wires to electrically connect said plurality of conductive pads provided on the top surface of said semiconductor chip with said plurality of conductive pads in a group corresponding to a semiconductor chip mounted on said chip mounting area; and
   a plurality of wirings provided on said semiconductor chip mounting surface and configured to electrically connect said plurality of conductive pads having the same function with each other between groups.

2. The semiconductor device according to claim 1, further comprising:
   a sealing resin provided to cover at least said semiconductor chip and a plurality of bonding wires.

3. The semiconductor device according to claim 1, wherein
   said semiconductor chip is a semiconductor memory chip.

4. The semiconductor device according to claim 1, wherein
   said plurality of types of semiconductor chips mountable on said plurality of chip mounting areas are semiconductor memory chips having different storage capacities.

5. The semiconductor device according to claim 1, wherein
   said plurality of types of semiconductor chips mountable on said plurality of chip mounting areas are semiconductor memory chips having the same function and different sizes.

6. The semiconductor device according to claim 1, further comprising:
   a plurality of conductive layers provided on a surface opposite said semiconductor chip mounting surface; and
   a plurality of through-hole conductors provided so as to pierce said semiconductor chip mounting surface and its opposite surface, said plurality of through-hole conductors electrically connects corresponding ones of said plurality of wirings and said plurality of conductive layers.

7. The semiconductor device according to claim 6, wherein some of said plurality of wirings for transmitting power supply potential or ground potential are branched to each chip mounting area in the middle of a path from said plurality of through-hole conductors to said plurality of conductive pads.

8. The semiconductor device according to claim 6, further comprising:
   a resist film provided on said semiconductor chip mounting surface so as to cover said plurality of wirings and provide a plurality of apertures for exposing a plurality of conductive pads in said plurality of groups formed on said insulated substrate.

9. The semiconductor device according to claim 1, wherein at least four of a plurality of conductive pads contained in said plurality of groups are equally arranged between said plurality of groups.

10. The semiconductor device according to claim 1, wherein said semiconductor chip is 250 $\mu$m or less in thickness, said resist film is 20 $\mu$m or more in thickness, and each one of said plurality of apertures on said resist film has an area of 1 mm$^2$ or less.

11. A semiconductor device comprising:
    an insulated substrate having a semiconductor chip mounting surface which provides a plurality of partially overlapping chip mounting areas;
    a plurality of conductive pads in a plurality of groups formed on said insulated substrate corresponding to semiconductor chips mountable on said plurality of chip mounting areas;

a semiconductor chip which is mounted on one of said plurality of chip mounting areas, said semiconductor chip having a plurality of conductive pads on the top surface;

a plurality of bonding wires to electrically connect said plurality of conductive pads provided on the top surface of said semiconductor chip with said plurality of conductive pads in a group corresponding to a semiconductor chip mounted on said chip mounting area; and wherein said semiconductor chip is 250 $\mu$m or less in thickness, said resist film is 20 $\mu$m or more in thickness, and each one of said plurality of apertures on said resist film has an area of 1 mm$^2$ or less.

* * * * *